United States Patent
Wang et al.

(10) Patent No.: US 10,276,522 B2
(45) Date of Patent: Apr. 30, 2019

(54) POWER MODULE

(71) Applicant: DELTA ELECTRONICS, INC., Taoyuan (TW)

(72) Inventors: Tao Wang, Taoyuan (TW); Zhen-Qing Zhao, Taoyuan (TW); Kai Lu, Taoyuan (TW); Zheng-Fen Wan, Taoyuan (TW); Hai-Bin Xu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 81 days.

(21) Appl. No.: 14/819,446

(22) Filed: Aug. 6, 2015

(65) Prior Publication Data
US 2016/0113107 A1 Apr. 21, 2016

(30) Foreign Application Priority Data
Oct. 15, 2014 (CN) .......................... 2014 1 0544857

(51) Int. Cl.
*H05K 3/34* (2006.01)
*H01L 23/00* (2006.01)

(52) U.S. Cl.
CPC ........... *H01L 24/00* (2013.01); *H05K 3/3431* (2013.01); *H01L 2224/32225* (2013.01); *H01L 2224/33* (2013.01); *H05K 2201/09745* (2013.01); *H05K 2201/10166* (2013.01); *H05K 2201/2036* (2013.01); *Y02P 70/613* (2015.11)

(58) Field of Classification Search
CPC ................. H01L 24/00; H05K 3/3431; H05K 2201/09745; H05K 2201/10166; H05K 2201/2036; Y02P 70/613

USPC ......................................................... 361/783
See application file for complete search history.

(56) References Cited

U.S. PATENT DOCUMENTS

| 5,128,746 | A | 7/1992 | Pennisi et al. | |
|---|---|---|---|---|
| 6,853,558 | B1 * | 2/2005 | Dixon | H05K 3/3405 174/260 |
| 2006/0170112 | A1 * | 8/2006 | Tanaka | H01L 23/481 257/777 |
| 2007/0120250 | A1 | 5/2007 | Fairchild et al. | |
| 2012/0300522 | A1 * | 11/2012 | Tokuyama | H01L 25/072 363/131 |
| 2013/0214368 | A1 * | 8/2013 | Fonk | B81C 1/00238 257/417 |
| 2013/0308276 | A1 | 11/2013 | Suzuki | |
| 2014/0264427 | A1 * | 9/2014 | Tischler | H01L 33/642 257/99 |
| 2015/0162312 | A1 * | 6/2015 | Shimizu | H05K 3/3463 257/712 |

FOREIGN PATENT DOCUMENTS

| CN | 102051141 A | 5/2011 |
|---|---|---|
| CN | 202259231 U | 5/2012 |
| CN | 104078431 A | 10/2014 |

* cited by examiner

*Primary Examiner* — Michael P McFadden
(74) *Attorney, Agent, or Firm* — CKC & Partners Co., LLC

(57) ABSTRACT

The disclosure discloses a power module. The power module includes a substrate, a power chip, a bonding material, and at least one spacer. The substrate includes a circuit-patterned layer. The power chip bonded to the circuit-patterned layer by the bonding material. The spacer is located between the circuit-patterned layer and the power chip, so as to keep the power chip away from the circuit-patterned layer in a distance.

17 Claims, 12 Drawing Sheets

POWER MODULE

RELATED APPLICATIONS

This application claims priority to Chinese Application Serial Number 201410544857.X, filed Oct. 15, 2014, which is herein incorporated by reference.

BACKGROUND

Technical Field

The present disclosure relates to a power module that achieves electrical energy conversion by electrically connecting semiconductor power chips.

Description of Related Art

In industrial products, power modules are widely used as core components for electrical energy conversion. Semiconductor power chips packaged in the power modules mainly include IGBTs (Insulated-Gate Bipolar Transistor), MOSFETs (Metal-Oxide Semiconductor Field Effect Transistor), FRDs (Fast Recovery Diode), and etc. High reliability of the power modules is a major goal that has been pursued continuously during designing of the modules, which means long-life time and low maintenance cost for those industrial system-level products.

FIG. 13A shows a cross-sectional view of a conventional power module. A power chip 91 of the power module is bonded to a DBC (Direct Bonded Copper) substrate 90 by solder 92. CTEs (Coefficient of thermal expansion) of the power chip 91 and the DBC substrate 90 are $4.1 \times 10^{-6}$ m/° C. and $7 \times 10^{-6} \sim 9 \times 10^{-6}$ m/° C. respectively, which are highly mismatched. When the power module works, the power chip 91 will conduct switching operations. As there is an internal resistance in the power chip 91, a large amount of on-state loss will be generated when a large current flows through the power chip 91 under on-state condition. Meanwhile, a large amount of switching loss will be generated during the switching operations by the power chip 91. The total loss comprised by the on-state loss and switching loss above will result in a large amount of heat, and thus the temperature of the power chip 91 will increase. High thermal stresses will be generated at the solder 92 due to large CTE mismatches between the power chip 91 and the DBC substrate 90 when temperature increasing. In addition, the power module may be operated in different modes, such as a light-load mode, a full-load mode, an overload mode, or even off-state mode. The temperature of the power chip 91 will change frequently when switched between those modes. Therefore, the solder 92 continuously will withstand the cyclic thermal stresses. Under long working hours, creep and thermal mechanical fatigue will occur in the solder 92 under long-time operation, resulting in the cracks 920 and final failure of the solder 92.

In the conventional power module, the power chip 91 is bonded onto the DBC substrate 90 by the solder 92 (e.g. solder paste with organics before soldering process) with the vacuum reflow soldering technology, achieving a sandwich structure. During soldering, the solder 92 melts, and organic solvents in the solder 92 are continuously vaporized to lift the power chip 91 up. Therefore, it is easy to make the thickness of the solder 92 be nonuniform and thus the power chip 91 tilts, as shown in FIG. 13B. A larger thermal stress occurs at the location with a smaller thickness of the solder 92. The thinner parts of the solder 92 are easily to be cracked, further resulting in fatigue failure of the solder 92. In order to ensure the lifetime of the solder 92 underneath the power chip 91, a solution to prolong the lifetime of the solder 92 is increasing the overall thickness of the solder 92, which will ensure the part with the smallest thickness of the solder 92 meeting the reliability requirement. However, more solder 92 will be employed, which will waste materials and increase the material costs. In addition, the thermal resistance of the power module will be increased by thicker average thickness of the solder 92, resulting in the deterioration of the thermal performance of the power module. Another solution is using novel bonding materials and technologies, such as LTJT (Low-Temperature Joining Technology), diffusion soldering, etc. Due to good thermomechanical performances of the novel technologies, the lifetime of the sandwich structure can be improved. However, the technologies need to adopt novel materials and equipments, which will increase the cost of materials and packaging processes.

Accordingly, a cost-effective method is highly required to improve the reliability of the bonding material 92 in a power module.

SUMMARY

Accordingly, the disclosure relates to a power module with a novel cost-effective solution to improve reliability of the bonding material 92.

The disclosure relates to a power module. The power module includes a first substrate, a first power chip, a first bonding material, and at least one first spacer. The first substrate includes a first circuit-patterned layer. The first bonding material is employed to bond the first power chip onto the first circuit-patterned layer. The first spacer is employed to support the first power chip on the first circuit-patterned layer.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed descriptions of the embodiments, with the following accompanying drawings as references.

DETAILED DESCRIPTION

Figure 1A:
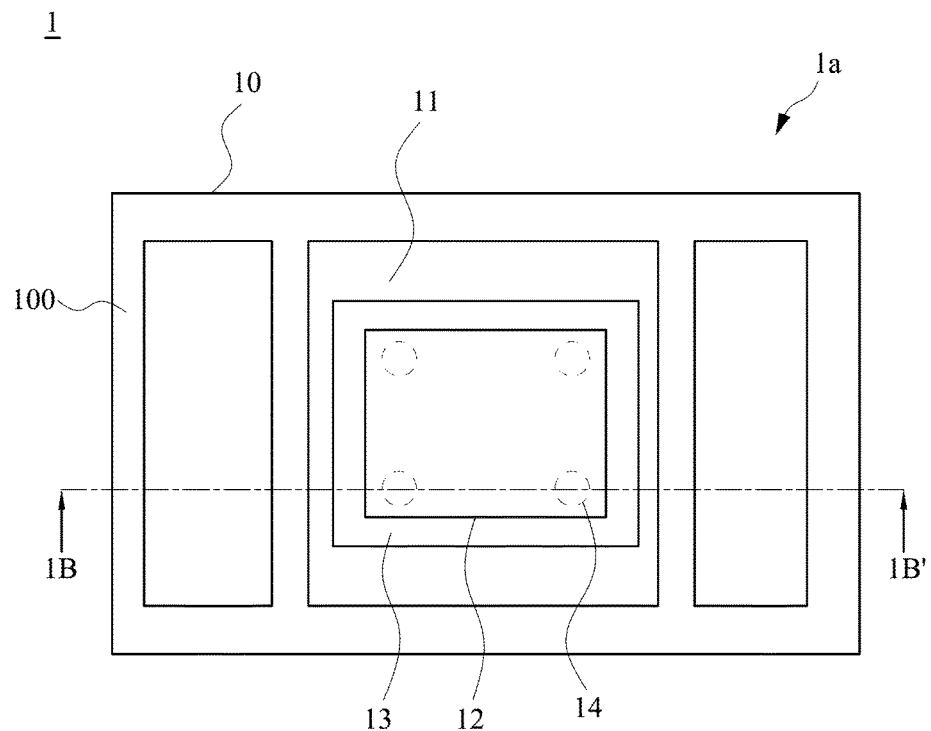
FIG. 1A demonstrates a top view of a power module according to an embodiment of the disclosure.

References will be introduced in detail to describe the present embodiments of the disclosure, which are illustrated in the accompanying drawings. Wherever possible, the same reference numbers are used in the drawings and the description to refer to the same or like parts.

Figure 1B:
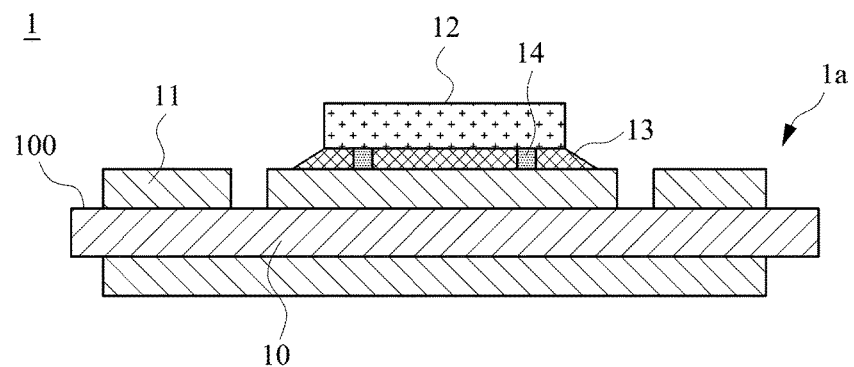
FIG. 1B demonstrates a cross-sectional view of the power module in FIG. 1A along line 1B-1B'.

FIG. 1A demonstrates a top view of a power module 1 according to an embodiment of the disclosure. FIG. 1B demonstrates a cross-sectional view of the power module 1 in FIG. 1A along line 1B-1B'. In the embodiment, the power module 1 includes a substrate 1a, a power chip 12, a bonding material 13, and spacers 14. The substrate 1a includes an insulating layer 10 and a circuit-patterned layer 11. The insulating layer 10 has a surface 100. The circuit-patterned layer 11 is located on the surface 100. The power chip 12 is bonded to the circuit-patterned layer 11 by the bonding material 13. The spacers 14 are employed as supports between the circuit-patterned layer 11 and the power chip 12. The smallest thickness of the bonding material 13 can be limited by the heights of the spacers 14. In addition, the heights of the spacers 14 can be identified based on the lifetime design, such as the relationship between lifetime, thermal stresses and height of the bonding material 13. Therefore, the thermal stresses induced by the mismatch of CTEs (Coefficient of thermal expansion) can be controlled by controlling the height of the bonding materials 13 during the operation of power module 1. Consequently, the expected or required lifetime of the bonding material 13 can be achieved by controlling the height of the bonding material 13.

In an embodiment, each of the spacers 14 is a metal powder sintered structure. That is, the spacers 14 are implemented by using the metal powder sintered technology. To manufacture the spacers 14, a metal paste can be firstly made by mixing some organic solvents with metal powder. The metal paste then is printed onto the designated positions of the substrate 1a by using the stencil-printing technology. The thickness of the metal paste can be determined by the thickness of the stencil. Subsequently, the substrate 1a printed with the metal paste is heated up to form the spacers 14 by sintering of metal power in the paste, as shown in FIG. 1B. Strong interconnection can be achieved between the spacers 14 and the substrate 1a due to atomic diffusion between them. The thickness of the bonding material 13 is determined by the thickness of the stencil in linear relationship. The material of the above-mentioned metal powder in the metal paste includes copper, silver, gold, and etc, but the disclosure is not limited in this regard. The above-mentioned organic solvents include ethanol, isopropanol, triethanolamine, polyvinyl alcohol, tributyl citrate, and etc., but the disclosure is not limited in this regard. The material of the circuit-patterned layer 11 of the substrate 1a can be bare copper, or can also be a metal layer coated with copper, gold, and silver, but the disclosure is not limited in this regard.

In another embodiment, each of the spacers 14 is made of a thixotropic material. For example, the thixotropic material can be adhered onto the designated positions of the spacers 14 on the substrate 1a by using the stencil-printing technology at first, and then it is cured short-term at high temperature or long-term at room temperature. The thickness of the spacers 14 could be determined by controlling the thickness of the stencil. In addition, the spacers 14 can also be manufactured with the thixotropic material by other technology, such as the dispensing technology. The thixotropic material includes epoxy resin or organic silicone. The epoxy resin of the thixotropic material is composed of main epoxy, diluent, curing agent, thixotropic agent, coupling agent, filler, and etc. The main epoxy of the epoxy resin includes dual-pentadiene epoxy resin, bisphenol epoxy resin, phenolic resin, organic carboxylic acids glycidyl ether epoxy resin, or vulcanized silicone rubber. The diluent of the epoxy resin includes at least one of N-butyl glycidyl ether, phenyl glycidyl ether, diglycidyl ether, diglycidyl aniline, or trimethylol propane triglycidyl ether. The curing agent of the epoxy resin includes at least one of polyamides, aromatic polyamines, aliphatic amines, alicyclic polyamines, polyether amines, phenolic ethylenediamine, and modified imidazol adducts. The thixotropic agent of the epoxy resin includes at least one of clay, quartz, talc, bentonite, anhydrous silica, polyamide wax, calcium carbonate, diatomaceous earth, mica, and metallic soap powder. The coupling agent of the epoxy resin includes at least one of trimethoxy silane, 3-aminopropyl trimethoxy silane, γ-methacryloyloxy propyl trimethoxy silane, 3-glycidyl trimethoxy silane, 3-propyl-A glycidyl dimethoxy silane, trimethoxy silane, methyl triclosan silane, dimethyl dichloro silane, and etc. The filler of the epoxy resin includes at least one of metallic conductive materials such as silver, nickel, copper, and etc., or inorganic insulating materials such as quartz, synthetic silica, crystalline silica, alumina, boron nitride, magnesium oxide, and etc. The organic silicone of the thixotropic material is composed of main silicone, condensation catalyst, promoting agent, crosslinking agent, thixotropic agent, filler, and etc. The main silicone of the organic silicone can be organic polysiloxane. The condensation catalyst of the organic silicone includes at least one of platinum, tin, titanium, cobalt, manganese, bismuth, and etc. The promoting agent of the organic silicone includes at least one of dibutyl tin diacetate, dibutyl tin, two methanol dibutyl tin oxide, dibutyl tin, and etc. The crosslinking agent of the organic silicone includes at least one of silicate tetra-n-propyl, original tetraethyl silicate, methyl trimethoxy silane, and etc. The thixotropic agent and the filler of the organic silicone of the thixotropic materials are respectively similar to those of the epoxy resin of the thixotropic materials. It should be pointed out that the thixotropic material with metal conductive fillers is defined as conductive thixotropic material, and the thixotropic material without the metal conductive fillers is defined as nonconductive thixotropic material. The hardness of the cured thixotropic material may be greater than Shore hardness A10, and the bonding strength of the cured thixotropic material with the substrate 1a may be greater than 100 Pa.

Figure 2:
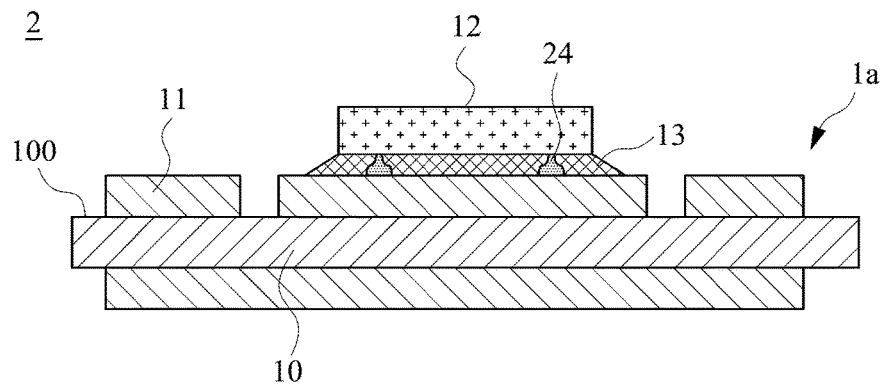
FIG. 2 demonstrates a cross-sectional view of a power module according to another embodiment of the disclosure.

FIG. 2 demonstrates a cross-sectional view of a power module 2 according to another embodiment of the disclosure. In the embodiment, the power module 2 similarly includes the substrate 1a, the power chip 12, and the bonding material 13, so they will not be introduced again here. Each of the spacers 24 of the embodiment is achieved by wire bonding technology. Taking gold wire bonding as an example, a circular stepped structure with certain height for the first bonding point can be achieved to form the spacers 24, as shown in FIG. 2. The height of the spacers 24 can be controlled by bonding parameters and wire diameter. By keeping the parameters of wire bonding for the first bonding point, the spacers 24 may have uniform heights. The material of the wire mentioned above could be the gold, silver, copper, aluminum and etc.

The foregoing three technologies (i.e., the metal powder sintered technology, the cured thixotropic material, and the wire bonding technology) for manufacturing the uniform spacers between the power chip 12 and the substrate 1a can be implemented not only on the surface of the substrate 1a but also on the bottom surface of the power chip 12.

Figure 3:
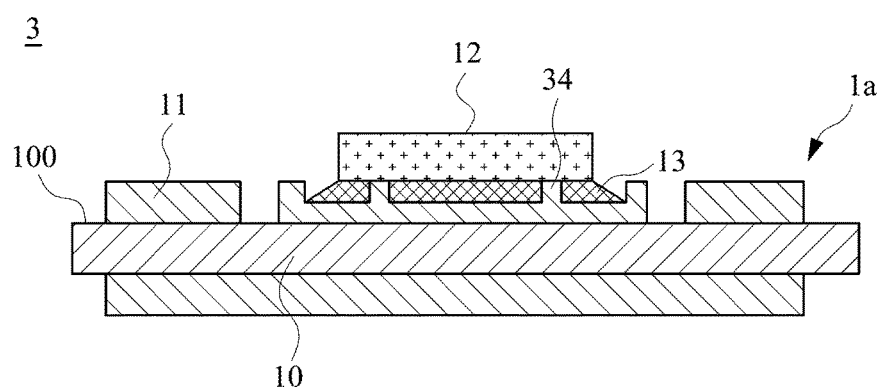
FIG. 3 demonstrates a cross-sectional view of a power module according to another embodiment of the disclosure.

FIG. 3 demonstrates a cross-sectional view of a power module 3 according to another embodiment of the disclosure. In the embodiment, the power module 3 includes the substrate 1a, the power chip 12, and the bonding material 13 similarly, so they will not be introduced again. Each of the spacers 34 is formed by patterning technology (e.g. Photolithography technology) on a circuit-patterned layer 11 of the substrate 1a. To manufacture the spacers 34, the circuit-patterned layer 11 is coated by photoresist at predetermined positions, and then the circuit-patterned layer 11 is etched to form the spacers 34 and circuit-patterned layer 11 formed as shown in FIG. 3. Finally, the photoresist is removed. The height of the spacers 34 can be precisely controlled by parameters such as the type of etching solution, the concentration of the etching solution, immersion time, temperature, and etc.

There should be height tolerance of the spacers manufactured by the foregoing technologies generally. In order to obtain the bonding material 13 with more uniform height, the height tolerance may be equal to or smaller than 100 μm, and in some embodiments, the height tolerance may be 0~10 μm.

In order to achieve a power module with uniform bonding material 13 by the spacers, the spacers 14, 24, 34 with uniform heights are firstly prepared onto the substrate 1a or the power chip 12 by the technologies. Secondly, the quantitative bonding material 13 (e.g., solder paste) is applied to a designated interconnection area on the substrate 1a, thereafter the power chip 12 is mounted on the applied bonding material 13. Finally, the bonding material 13 is processed (e.g., melted) by a solder reflow process. In some aspects, owing to the function of the spacers 14, 24, 34 with uniform height, the thickness of the bonding material 13 can be controlled well, so as to ensure the reliability of the bonding material 13. Meanwhile, there is no need to use more bonding material 13 to ensure the part with the smallest thickness of the solder 92 meeting the reliability requirement. The thermal resistance and costs of the power modules 1, 2, 3 could be reduced.

Figure 4A:
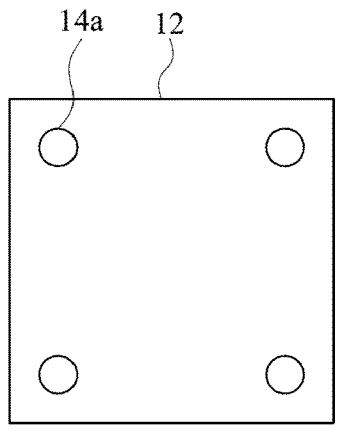
FIGS. 4A~4F demonstrate bottom views of the spacers underneath the power chip with different shapes.
Figure 4B:
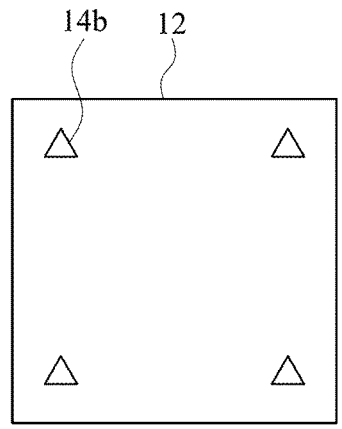
Figure 4C:
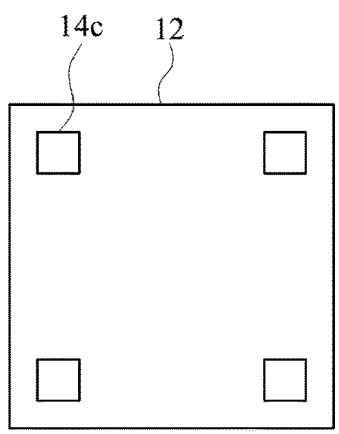
Figure 4D:
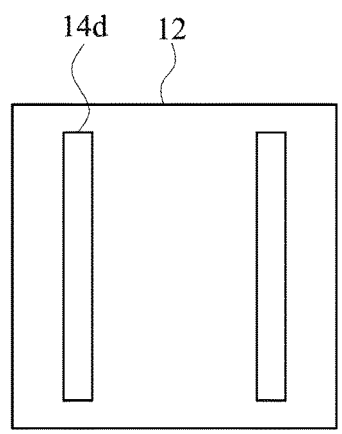
Figure 4E:
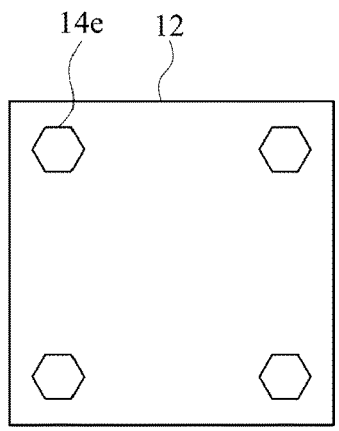
Figure 4F:
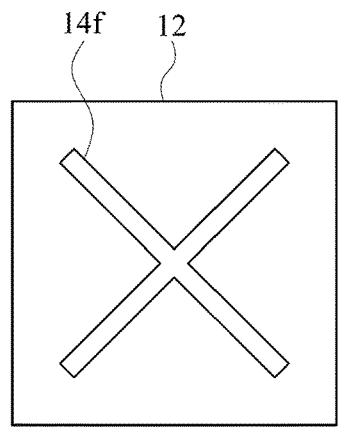

FIGS. 4A~4F demonstrate bottom views of the spacers 14a~14f underneath the power chip 12 with different shapes. As shown in FIG. 4A, each of the spacers 14a is circular in a cross-sectional view. As shown in FIG. 4B, each of the spacers 14b is triangular in a cross-sectional view. As shown in FIG. 4C, each of the spacers 14c is square in a cross-sectional view. As shown in FIG. 4D, each of the spacers 14d is rectangular in a cross-sectional view. As shown in FIG. 4E, each of the spacers 14e is polygonal in a cross-sectional view. As shown in FIG. 4F, each of the spacers 14f is an intersecting graph in a cross-sectional view. The spacers 14d and 14f can be implemented by the foregoing dispensing technology. However, the shape of the spacers in cross-sectional view is not limited by these embodiments.

Figure 5A:
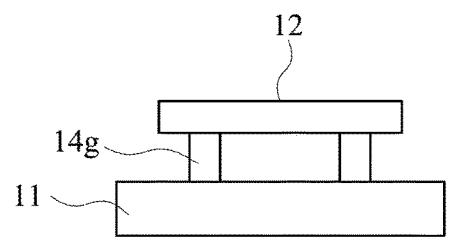
FIGS. 5A~5E demonstrate side views of the spacers between the circuit-patterned layer and the power chip with different shapes.
Figure 5B:
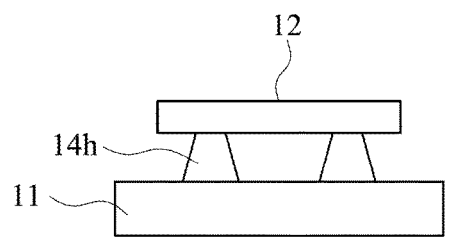
Figure 5C:
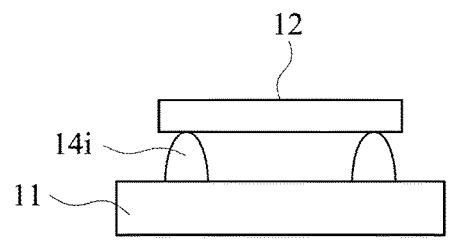
Figure 5D:
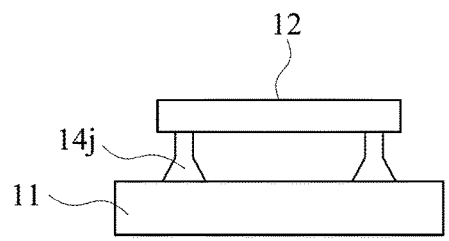
Figure 5E:
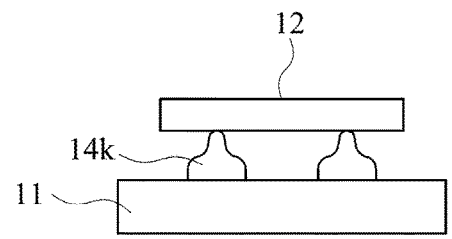

FIGS. 5A~5E demonstrate side views of the spacers 14g~14k between the circuit-patterned layer 11 and the power chip 12 with different shapes. As shown in FIG. 5A, each of the spacers 14g is cylindrical in a side view. As shown in FIG. 5B, each of the spacers 14h is trapezoidal in a side view. As shown in FIG. 5C, each of the spacers 14i is arc-shaped in a side view. As shown in FIG. 5D, each of the spacers 14j is a gradient shape in a side view. As shown in FIG. 5E, each of the spacers 14k is a stepped shape in a side view. The spacers 14i can be implemented by the dispensing technology, the spacers 14j can be implemented by the foregoing patterning technology, and the spacers 14k can be implemented by the foregoing wire bonding technology. However, the shape of the spacers in side view is not limited by these embodiments.

Figure 6A:
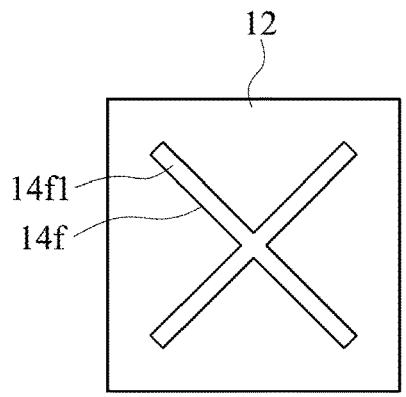
FIGS. 6A~6E demonstrate bottom views of the spacers underneath the rectangular power chip with different numbers.
Figure 6B:
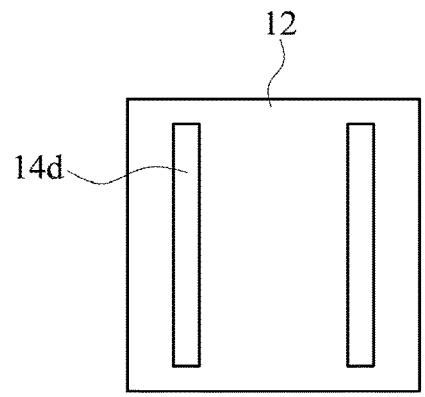
Figure 6C:
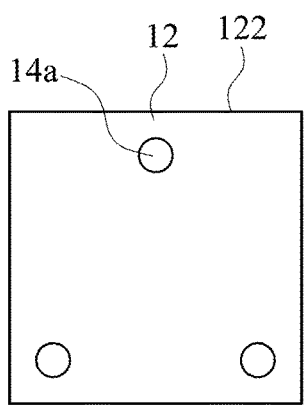
Figure 6D:
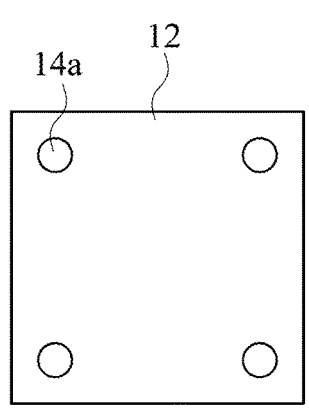
Figure 6E:
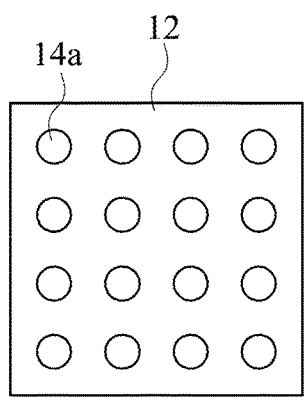
Figure 7A:
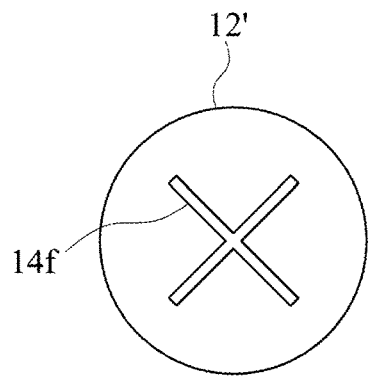
FIGS. 7A~7E demonstrate bottom views of the spacers underneath the circular power chip with different numbers.
Figure 7B:
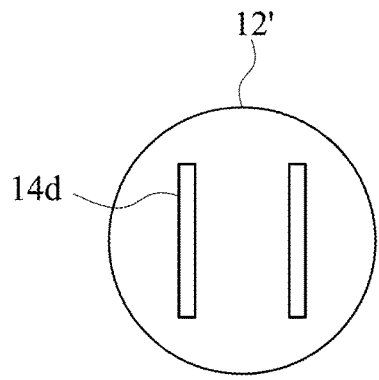
Figure 7C:
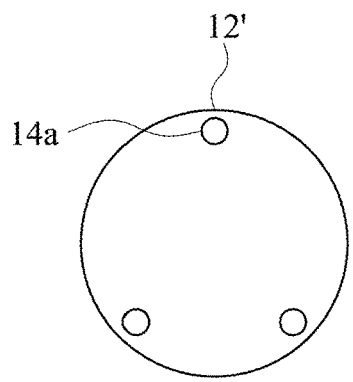
Figure 7D:
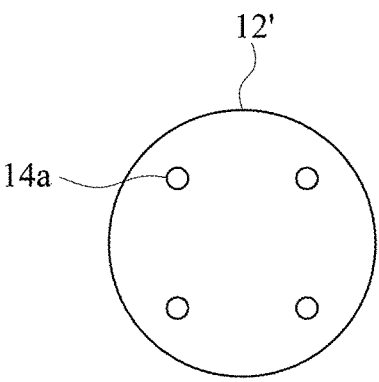
Figure 7E:
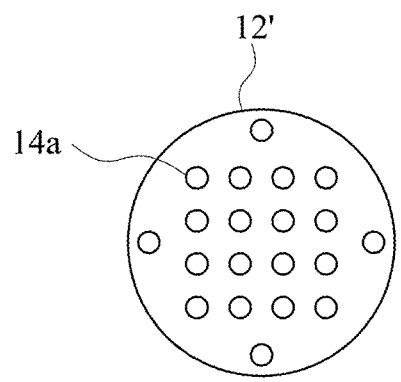

FIGS. 6A~6E demonstrate bottom views of the spacers 14a, 14d, 14f underneath the rectangular power chip 12 with different numbers. As shown in FIG. 6A, only one spacer 14f is connected to the power chip 12. The spacer 14f has four extensions 14f1. The extensions 14f1 extend toward the four corners of the power chip 12 respectively. By supporting the corners of the power chip 12 using the four extending portions 14f1, the power chip 12 can be steadily supported on the substrate 1a. As shown in FIG. 6B, there are two rectangular spacers 14d. In addition, the spacers 14d are adjacent to two edges of the power chip 12 respectively (i.e., the right and left edges in FIG. 6B), so the power chip 12 can also be steadily supported on the substrate 1a. As shown in FIG. 6C, the number of the spacers 14a is three. One of the spacers 14a is adjacent to an edge of the power chip 12, and the rest two spacers 14a are respectively adjacent to two corners of the power chip 12, so the power chip 12 can also be steadily supported on the substrate 1a. As shown in FIG. 6D, the number of the spacers 14a is four, and the spacers 14a are adjacent to four corners of the power chip 12 respectively, so the power chip 12 can also be steadily supported on the substrate 1a. As shown in FIG. 6E, the number of the spacers 14a is more than four, and the spacers 14a are uniformly distributed underneath the power chip 12 (e.g., arranged in a 4×4 matrix), so the power chip 12 can also be steadily supported on the substrate 1a. However, the number and layout of the spacer(s) is not limited by these embodiments.

FIGS. 7A~7E demonstrate bottom views of the spacers 14a, 14d, 14f underneath the circular power chip 12' with different numbers. The circular power chip 12' can be a wafer-level diode, a thyristor, IGCTs (Integrated Gate-Commutated Thyristor), or IGCTs (Insulated Gate Bipolar Transistor), but the disclosure is not limited in this regard. The shape of the spacers 14a, 14d, 14f respective to the circular power chip 12' are similar to those of the spacers 14a, 14d, 14f respective to the rectangular power chip 12 in bottom view. The ending of spacers 14a and 14d are adjacent to the edge of the power chip 12' in FIG. 7A and FIG. 7D respectively. The spacers 14f are adjacent to the edge of the power chip 12' in FIG. 7C and FIG. 7D. The spacers 14f are uniformly distributed underneath the power chip 12'. Therefore, the power chip 12' can also be steadily supported on the substrate 1a. However, the number and layout of the spacer(s) is not limited by these embodiments.

Regarding to the layouts of the spacers of which the numbers are larger than one, a gap between any two adjacent spacers must be larger than 1 μm, and in some embodiments, the manufacturability may be better if the gap is larger than 200 μm.

Figure 8:
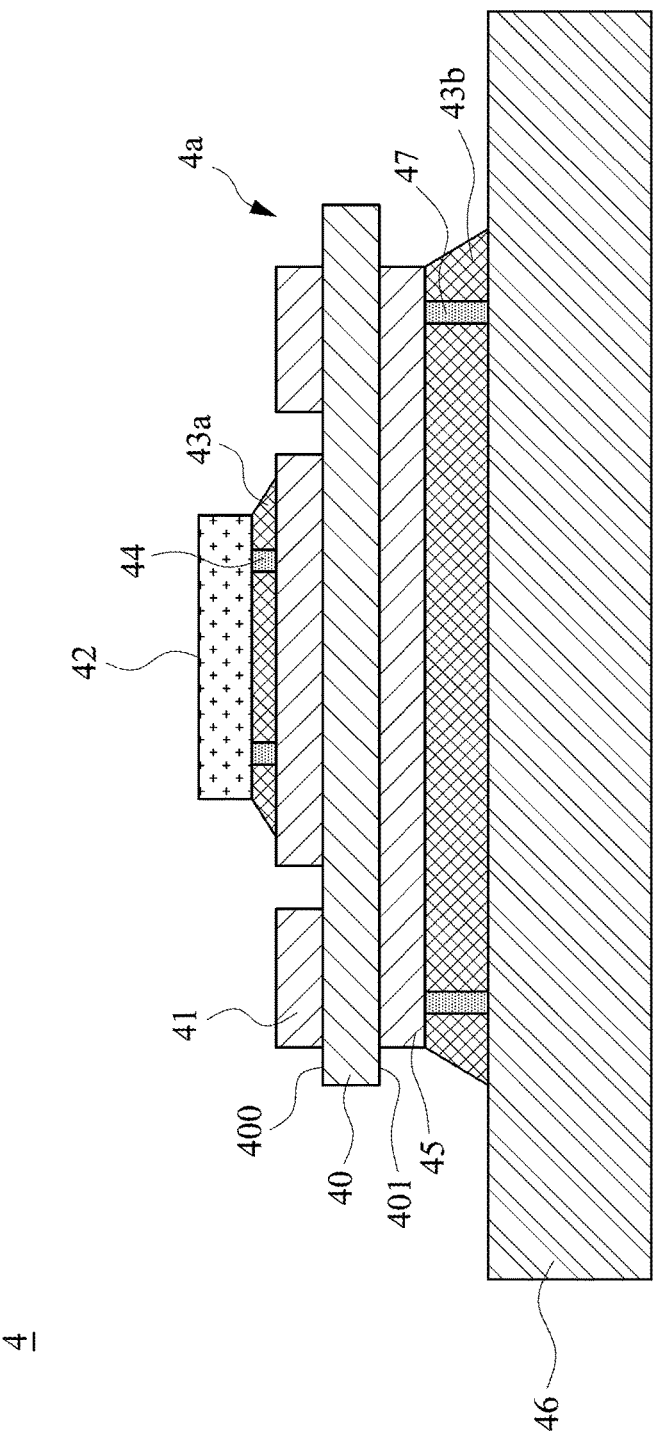
FIG. 8 demonstrates a cross-sectional view of a power module according to another embodiment of the disclosure.

FIG. 8 demonstrates a cross-sectional view of a power module 4 according to another embodiment of the disclosure. In the embodiment, the power module 4 includes a substrate 4a, a power chip 42, a first bonding material 43a, first spacers 44, a base plate 46, a second bonding material 43b, and second spacers 47. The substrate 4a includes an insulating layer 40, a first circuit-patterned layer 41, and a second circuit-patterned layer 45. The insulating layer 40 has a first surface 400 and a second surface 401 (i.e., the top and bottom surfaces of the insulating layer 40). The first circuit-patterned layer 41 is located on the first surface 400. The second circuit-patterned layer 45 is located on the second surface 401. The power chip 42 is bonded onto the first circuit-patterned layer 41 by the first bonding material 43a. The first spacers 44 are employed as supports between the first circuit-patterned layer 41 and the power chip 42. The second circuit-patterned layer 45 is bonded onto the base plate 46 by the second bonding material 43b. The second spacers 47 are employed as supports between the second circuit-patterned layer 45 and the base plate 46.

In some embodiments, a mismatch of CTEs occurs between the substrate 4a and the base plate 46. High thermal stresses will be generated at the second bonding material 43b due to large CTE mismatches between the substrate 4a and the base plate 46 when temperature increasing due to the operation of the power chip 42. There should be reliability issue for the second bonding material 43b. Therefore, the second spacers 47 can also ensure the reliability of the second bonding material 43b between the substrate 4a and the base plate 46. Compared with the conventional power module without the second spacers 47, there is no need to use more bonding material 13 in the embodiment to ensure the part with the smallest thickness of the solder 92 meeting the reliability requirement. The thermal resistance of the power modules 4 could be reduced. The material of the base plate 46 may be copper, aluminum, AlSiC (Aluminum Silicon Carbide), or AlN (Aluminum Nitride), and the material of the base plate 46 may also be the same as that of the foregoing substrate 4a, but the disclosure is not limited in this regard.

Figure 9:
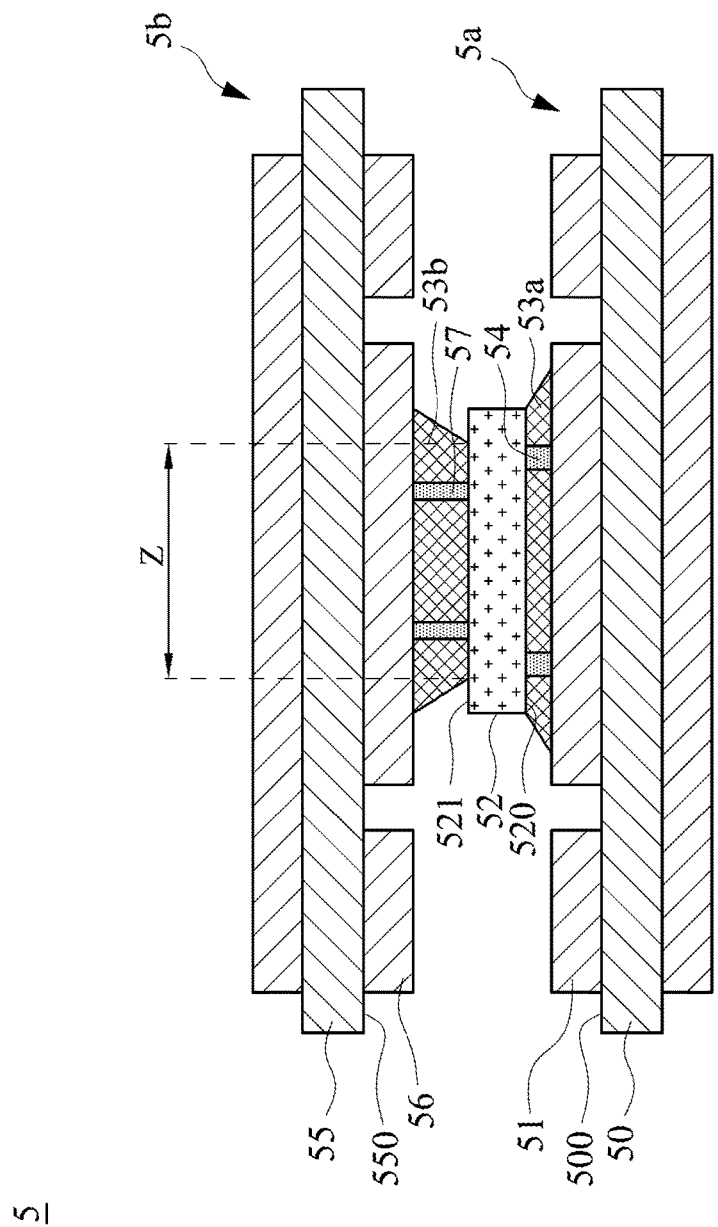
FIG. 9 demonstrates a cross-sectional view of a power module according to another embodiment of the disclosure.

FIG. 9 demonstrates a cross-sectional view of a power module 5 according to another embodiment of the disclosure. In the embodiment, the power module 5 includes a first substrate 5a (i.e., the lower substrate), a power chip 52, a first bonding material 53a, first spacers 54, a second substrate 5b (i.e., the upper substrate), a second bonding material 53b, and second spacers 57. The first substrate 5a includes a first insulating 50 and a first circuit-patterned layer 51. The first insulating layer 50 has a first surface 500. The first circuit-patterned layer 51 is located on the first surface 500. The power chip 52 has a bottom surface 520 and the top surface 521. The bottom surface 520 of the power chip 52 is bonded onto the first circuit-patterned layer 51 by the first bonding material 53a. The first spacers 54 are employed as supports between the first circuit-patterned layer 51 and the bottom surface 520. The second substrate 5b includes a second insulating layer 55 and a second circuit-patterned layer 56. The second insulating layer 55 has a second surface 550. The second circuit-patterned layer 56 is located on the second surface 550. The top surface 521 of the power chip 52 is bonded onto the second circuit-patterned layer 56 by the second bonding material 53b. The second spacers 57 are employed as supports between the second circuit-patterned layer 56 and the top surface 521.

In some embodiments, the thickness of the first bonding material 53a on the bottom surface 520 of the power chip 52 can be uniformly controlled by the first spacers 54 located between the power chip 52 and the first substrate 5a. The thickness of the second bonding material 53b on the top surface 521 of the power chip 52 can be uniformly controlled by the second spacers 57 located between the power chip 52 and the second substrate 5b. The first spacers 54 and the second spacers 57, which are located on the surface 520 and the surface 521 of the power chip 52 respectively, can ensure the reliability of the first bonding material 53a and the second bonding material 53b respectively. Meanwhile, the heat generated by the power chip 52 during operation can be dissipated by passing the first substrate 5a and the second substrate 5b. The thermal resistance of the power module 5 may be reduced.

As there is a large electric potential difference between the edge and the emitter of an IGBT (Insulated-Gate Bipolar Transistor), the electric potential difference between the upper substrate bonded to the emitter and an edge of the IGBT is also large. The electric field is easily concentrated between the edge of the IGBT and the upper substrate, so voltage breakdowns are likely occurred. Therefore, the second spacers 57 of the embodiment may effectively control the gap height between the second substrate 5b and the top surface 521 of the power chip 52, so as to prevent the voltage breakdowns from occurring between the edge of the power chip 52 and the second substrate 5b. As shown in FIG. 9, the top surface 521 of the power chip 52 has a bonding region Z, and the second spacers 57 are located in the bonding region Z, but the disclosure is not limited in this regard.

Figure 10:
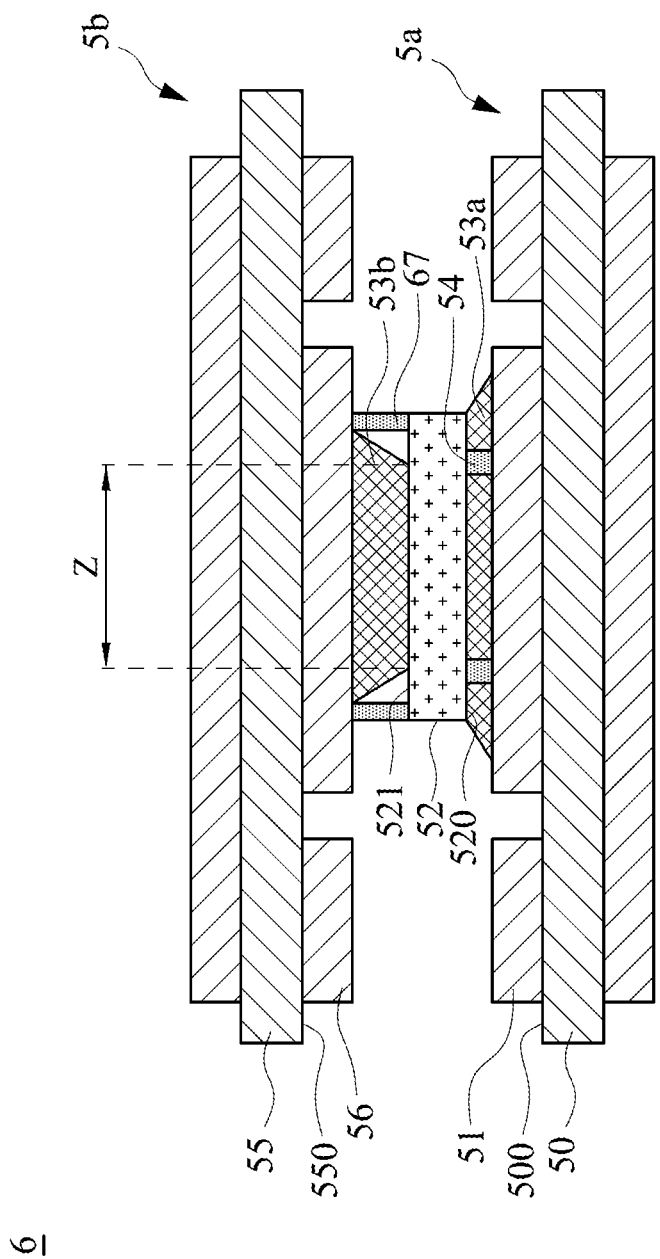
FIG. 10 demonstrates a cross-sectional view of a power module according to another embodiment of the disclosure.

FIG. 10 demonstrates a cross-sectional view of a power module 6 according to another embodiment of the disclosure. In the embodiment, the power module 6 includes the first substrate 5a, the power chip 52, the first bonding material 53a, the first spacers 54, the second substrate 5b, and the second bonding material 53b which are similar to the embodiment in FIG. 9, so they will not be introduced again. A difference between the present embodiment and the embodiment in FIG. 9 is that the second spacers 67 of the present embodiment are located out of the bonding region Z (i.e., the second spacers 67 are located on the guard ring of the power chip 52). The second spacers 67 should be made of insulating materials, such as the foregoing nonconductive thixotropic materials.

Figure 11:
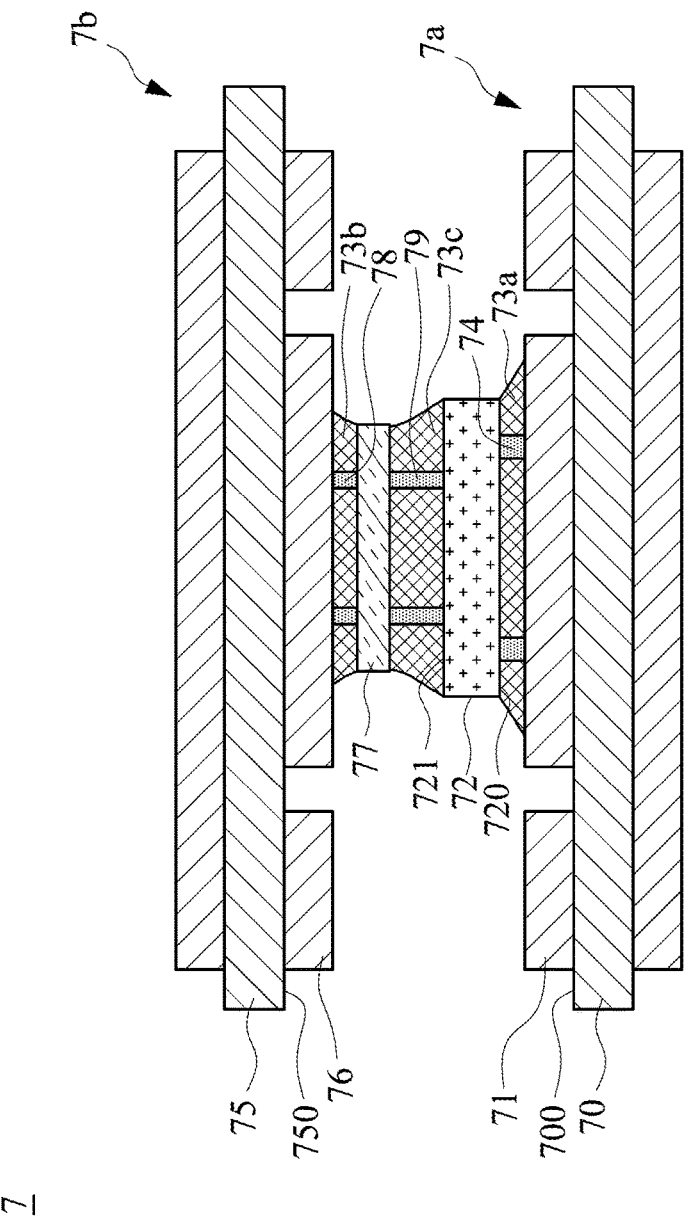
FIG. 11 demonstrates a cross-sectional view of a power module according to another embodiment of the disclosure.

FIG. 11 demonstrates a cross-sectional view of a power module 7 according to another embodiment of the disclosure. In the embodiment, the power module 7 includes a first substrate 7a (i.e., the lower substrate), a power chip 72, a first bonding material 73a, first spacers 74, a second substrate 7b (i.e., the upper substrate), a shim 77, a second bonding material 73b, second spacers 78, a third bonding material 73c, and third spacers 79. The first substrate 7a includes a first insulating layer 70 and a first circuit-patterned layer 71. The first insulating layer 70 has a first surface 700. The first circuit-patterned layer 71 is located on the first surface 700. The power chip 72 has a bottom surface 720 and a top surface 721. The bottom surface 720 of the power chip 72 is bonded to the first circuit-patterned layer 71 by the first bonding material 73a. The first spacers 74 are employed as supports between the first circuit-patterned layer 71 and the bottom surface 720. The second substrate 7b includes a second insulating layer 75 and a second circuit-patterned layer 76. The second insulating layer 75 has a second surface 750. The second circuit-patterned layer 76 is located on the second surface 750. The shim 77 is located between the second circuit-patterned layer 76 and the top surface 721. The second circuit-patterned layer 76 and the shim 77 are bonded by the second bonding material 73b. The second spacers 78 are employed as supports between the second circuit-patterned layer 76 and the shim 77. The third spacers 79 are employed as supports between the top surface 721 and the shim 77.

In some embodiments, in order to prevent the foregoing voltage breakdowns, the bondable shim 77 can be added between the power chip 72 and second substrate 7b, so as to increase the gap height between the power chip 72 and second substrate 7b for high voltage application. In the power module 7 of the embodiment, the spacers 74 in the first bonding material 73a between the first substrate 7a and the power chip 72, and the spacers 78 in the second bonding material 73b between the second substrate 7b and the shim 77, and the spacers 79 in the third bonding material 73c between the power chip 72 and the shim 77 are implemented by the foregoing manufacturing technologies, so as to obtain the uniform bonding materials. The shim 77 includes conductive materials such as metals (e.g., copper, molybdenum, silver), alloys (e.g., Kovar, W/Cu alloy, Mo/Cu alloy), and etc., but the disclosure is not limited in this regard.

Figure 12:
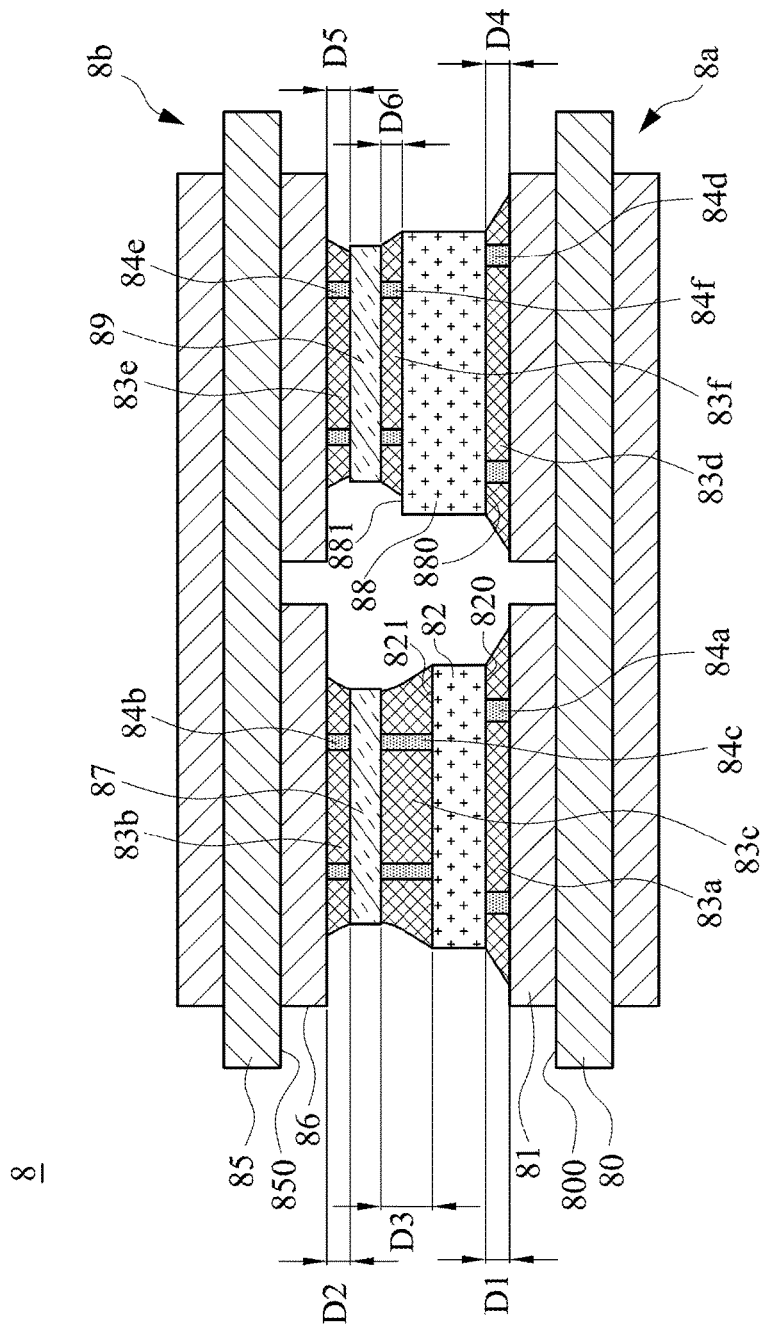
FIG. 12 demonstrates a cross-sectional view of a power module according to another embodiment of the disclosure.
Figure 13A:
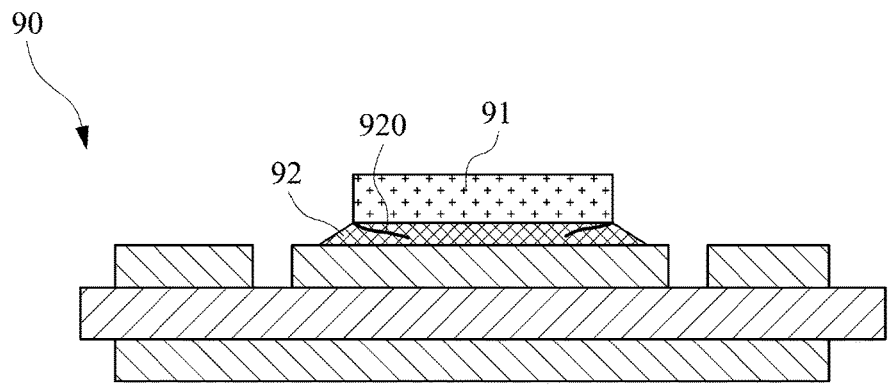
FIG. 13A demonstrates a cross-sectional view of a conventional power module with the cracked bonding material.
Figure 13B:
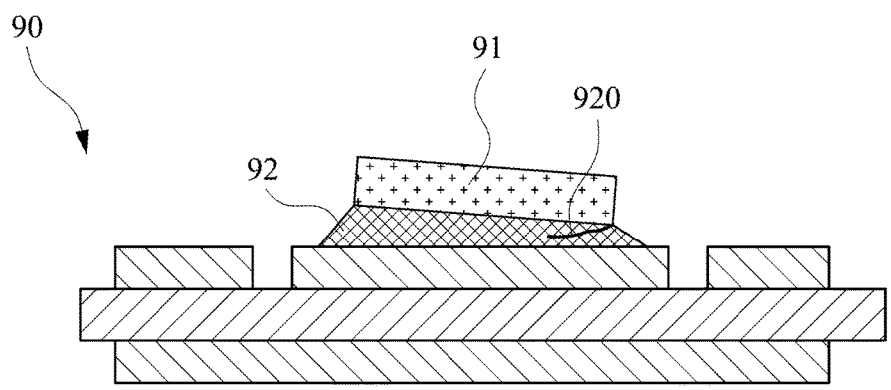
FIG. 13B demonstrates a cross-sectional view of a tilted power chip in a power module in with the cracked bonding material.

FIG. 12 demonstrates a cross-sectional view of a power module 8 according to another embodiment of the disclosure. In the embodiment, the power module 8 includes a first substrate 8a (i.e., the lower substrate), a first power chip 82, a first bonding material 83a, first spacers 84a, a second substrate 8b (i.e., the upper substrate), a first shim 87, a second bonding material 83b, second spacers 84b, a third bonding material 83c, third spacers 84c, a second power chip 88, a fourth bonding material 83d, fourth spacers 84d, a second shim 89, a fifth bonding material 83e, fifth spacers 84e, a six bonding material 83f, and sixth spacers 84f. The first substrate 8a includes a first insulating layer 80 and a first circuit-patterned layer 81. The first insulating layer 80 has a first surface 800. The first circuit-patterned layer 81 is located on the first surface 800. The first power chip 82 has a first bottom surface 820 and a first top surface 821. The first circuit-patterned layer 81 and the first bottom surface 820 are bonded by the first bonding material 83a. The first spacers 84a are employed as supports between the first circuit-patterned layer 81 and the first bottom surface 820. The second substrate 8b includes a second insulating layer 85 and a second circuit-patterned layer 86. The second insulating layer 85 has a second surface 850. The second circuit-patterned layer 86 is located on the second surface 850. The first shim 87 is located between the second circuit-patterned layer 86 and the first top surface 821. The second circuit-patterned layer 86 and the first shim 87 are bonded by the second bonding material 83b. The second spacers 84b are employed as supports between the second circuit-patterned layer 86 and the first shim 87. The first top surface 821 and the first shim 87 are bonded by the third bonding material 83c. The third spacers 84c are employed as supports between the first top surface 821 and the first shim 87. The second power chip 88 is located between the first circuit-patterned layer 81 and the second circuit-patterned layer 86. The second power chip 88 has a second bottom surface 880 and a second top surface 881. The first circuit-patterned layer 81 and the second bottom surface 880 are bonded by the fourth bonding material 83d. The fourth spacers are employed as supports between the first circuit-patterned layer 81 and the second bottom surface 880. The second shim 89 is located between the second circuit-patterned layer 86 and the second top surface 881. The second circuit-patterned layer 86 and the second shim 89 are bonded by the fifth bonding material 83e. The fifth spacers 84e are employed as supports between the second circuit-patterned layer 86 and the second shim 89. The second top surface 881 and the second shim 89 are bonded by the sixth bonding material 83f. The sixth spacers 84f are employed as supports between the second top surface 881 and the second shim 89.

It can be seen that there are two surfaces of each of two power chips (or more than two power chips) bonded to two substrates in the power module 8 for the embodiment, so as to achieve different circuit topologies and functions. The power chips may have different thicknesses due to different functions of the chips and semiconductor manufacturing processes. Regarding to the power chips with different thicknesses, the spacers in the bonding materials may compensate the thickness difference(s), so as to obtain uniform bonding materials in different bonding layers, and further achieve the double-side bonding structure of the two power chips (or more than two power chips) with good bonding quality in the embodiment of power module.

As shown in FIG. 12, in the embodiment, each of the first spacers 84a has a first height D1. Each of the second spacers 84b has a second height D2. Each of the third spacers 84c has a third height D3. Each of the fourth spacers 84d has a fourth height D4. Each of the fifth spacers 84e has a fifth height D5. Each of the sixth spacers 84f has a sixth height D6. The first height D1 is equal to the fourth height D4. The second height D2 is equal to the fifth height D5. A thickness of the first shim 87 is equal to a thickness of the second shim 89. A difference between a thickness of the first power chip 82 and a thickness of the second power chip 88 is equal to a difference between the third height D3 and the sixth height D6. The same height for the first spacers 84a and the fourth spacers 84d, and the same height for the second spacers 84b and the fifth spacers 84e, and the same height for the first shim 87 and the second shim 89 will make the manufacturing controlled easily, because the spacers (e.g. the first spacers 84a and the fourth spacers 84d, or the second spacers 84b and the fifth spacers 84e) or the shims (e.g. the first shim 87 and the second shim 89) with the same height can be manufactured in one step at the same time. Therefore, the difference between the thickness of the first power chip 82 and the thickness of the second power chip 88 can be compensated by the same difference between the third height D3 of the third spacers 84c and the sixth height D6 of the sixth spacers 84f.

However, the disclosure is not limited in this regard. In other embodiments, the difference between the thicknesses of the first power chip 82 and the thickness of the second power chip 88 can also be compensated by adjusting any height of the spacers or by adjusting the thicknesses of the first shim 87 and the second shim 89.

The foregoing approach of thickness compensation for the difference between the thicknesses of the first power chip 82 and the thickness of the second power chip 88 can also be applied to power modules with more than two power chips.

In practical applications, each of the substrates in the foregoing embodiments can only include a circuit-patterned layer without an insulating layer. The foregoing substrates can be PCBs (Printed Circuit Board), DBC (Direct Bonding Copper) substrates, DBA (Direct Bonding Aluminum) substrates, metal co-fired ceramic substrates, IMS (Insulated Metal Substrate) substrates, LFs (Lead-Frame), metal substrates (e.g., copper, aluminum), AlSiC (Aluminum Silicon Carbide) and etc., in which the LFs and the metal substrates must include circuit-patterned layers or surface conduction layers and may not include insulating layers. It should be pointed out that the disclosure is not limited in this regard.

In practical applications, the power chips in the foregoing embodiments can be IGCTs, MOSFETs (Metal-Oxide Semiconductor Field Effect Transistor), diodes, thyristors, IGCTs (Integrated Gate-Commutated Thyristor), and etc., but the disclosure is not limited in this regard.

In practical applications, the bonding materials in the foregoing embodiments can be not only solder but also low-temperature sintering materials (e.g., materials such as silver or copper paste that can be sintered to achieve the bonding between a power chip and a substrate at low temperatures), conductive silver paste, and etc.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A power module, comprising:
   a first substrate comprising a first circuit-patterned layer and a first insulating layer, the first insulating layer having a first surface on which the first circuit-patterned layer is located;
   a first power chip having a first bottom surface and a first top surface;
   a first bonding material bonding the first power chip to the first circuit-patterned layer connected to the first bottom surface; and
   at least one first spacer located and employed as supports between a surface of the first circuit-patterned layer facing toward the first power chip and the bottom surface, the first spacer having a first height;
   a second substrate comprising a second insulating layer and a second circuit-patterned layer, wherein the second insulating layer has a second surface, and the second circuit-patterned layer is located on the second surface;
   a second bonding material bonding the first top surface to the second circuit-patterned layer; and
   at least one second spacer employed as supports between the second circuit-patterned layer and the first top surface,
   wherein a smallest thickness of a portion of the first bonding material in between the first substrate and the first power chip is equal to the first height.

2. The power module of claim 1, wherein the first spacer is a metal powder sintered structure.

3. The power module of claim 1, wherein the first spacer is made of a thixotropic material.

4. The power module of claim 1, wherein the first spacer is a structure by wire bonding technology.

5. The power module of claim 1, wherein the first spacer is a structure by patterning technology formed on the first circuit-patterned layer.

6. The power module of claim 1, wherein the first spacer is circular, polygonal, or an intersecting graph in a cross-sectional view.

7. The power module of claim 1, wherein the first spacer is cylindrical, trapezoidal, arc-shaped, a gradient shape, or a stepped shape in a side view.

8. The power module of claim 1, wherein the number of the at least one first spacer is two, and the first spacers are adjacent to two opposite edges of the first power chip respectively.

9. The power module of claim 1, wherein the number of the at least one first spacer is three, and each of the first spacers is adjacent to a corner or an edge of the first power chip.

10. The power module of claim 1, wherein the number of the at least one first spacer is four, the first power chip has four corners, and the first spacers are respectively adjacent to the corners.

11. The power module of claim 1, wherein the number of the at least one first spacer is plural, and the first spacers are uniformly distributed underneath the first power chip.

12. The power module of claim 1, wherein the first top surface has a bonding region and the second spacer is located within the bonding region.

13. The power module of claim 1, wherein the first top surface has a bonding region, the second spacer is located out of the bonding region, and is made of an insulating material.

14. The power module of claim 1, wherein the first spacer has four extensions, the first power chip has four corners, and the extensions respectively extend toward the corners.

15. The power module of claim 14, further comprising:
   a second power chip located between the first circuit-patterned layer and the second circuit-patterned layer, the second power chip having a second bottom surface and a second top surface;
   a fourth bonding material bonding the second bottom surface to the first circuit-patterned layer;
   at least one fourth spacer employed as supports between the first circuit-patterned layer and the second bottom surface;
   a second shim located between the second circuit-patterned layer and second top surface;
   a fifth bonding material bonding the second shim to the second circuit-patterned layer;
   at least one fifth spacer employed as supports between the second circuit-patterned layer and the second shim;
   a sixth bonding material bonding the second shim to the second top surface; and
   at least one sixth spacer employed as supports between the second top surface and the second shim.

16. A power module, comprising:
   a first substrate comprising a first circuit-patterned layer and a first insulating layer, the first insulating layer having a first surface on which the first circuit-patterned layer is located;
   a first power chip having a first bottom surface and a first top surface;
   a first bonding material bonding the first power chip to the first circuit-patterned layer and connected to the first bottom surface;
   at least one first spacer connected to the first bottom surface and employed as supports between the first circuit-patterned layer and the first power chip;
   a second substrate comprising a second insulating layer and a second circuit-patterned layer, wherein the second insulating layer has a second surface, and the second circuit-patterned layer is located on the second surface;
   a first shim located between the second circuit-patterned layer and the first top surface;
   a second bonding material bonding the first shim to the second circuit-patterned layer;
   at least one second spacer employed as supports between the second circuit-patterned layer and the first shim;

a third bonding material bonding the first top surface and the first shim; and at least one third spacer employed as supports between the first top surface and the first shim.

17. The power module of claim 16, wherein the second spacer has a second height, the third spacer has a third height, the fourth spacer has a fourth height, the fifth spacer has a fifth height, the sixth spacer has a sixth height, the first height is equal to the fourth height, the second height is equal to the fifth height, a thickness of the first shim is equal to a thickness of the second shim, and a difference between a thickness of the first power chip and a thickness of the second power chip is equal to a difference between the third height and the sixth height.

* * * * *